United States Patent
Määttä et al.

(10) Patent No.: US 10,209,792 B2
(45) Date of Patent: Feb. 19, 2019

(54) APPARATUS AND METHOD WHEREIN THE APPARATUS COMPRISES A FLEXIBLE DISPLAY AND A FLEXIBLE TOUCH SENSITIVE MODULE

(71) Applicant: Nokia Technologies Oy, Espoo (FI)

(72) Inventors: Esa-Sakari Määttä, Espoo (FI); Ilpo Kalevi Kauhaniemi, Vantaa (FI)

(73) Assignee: Nokia Technologies Oy, Espoo (FI)

( * ) Notice: Subject to any disclaimer, the term of this patent is extended or adjusted under 35 U.S.C. 154(b) by 374 days.

(21) Appl. No.: 14/712,850

(22) Filed: May 14, 2015

(65) Prior Publication Data
US 2015/0338944 A1 Nov. 26, 2015

(30) Foreign Application Priority Data
May 20, 2014 (GB) .................................. 1408902.3

(51) Int. Cl.
*G06F 3/041* (2006.01)
*G06F 1/16* (2006.01)
*H05K 1/02* (2006.01)

(52) U.S. Cl.
CPC ............ *G06F 3/041* (2013.01); *G06F 1/1652* (2013.01); *G06F 3/0412* (2013.01); *H05K 1/028* (2013.01); *G06F 2203/04102* (2013.01); *G06F 2203/04103* (2013.01); *H05K 2201/10128* (2013.01); *Y10T 29/49156* (2015.01)

(58) Field of Classification Search
CPC ......... G06F 3/045; G06F 3/044; G06F 3/0414
USPC ................................................. 345/173, 174
See application file for complete search history.

(56) References Cited

U.S. PATENT DOCUMENTS

| | | | |
|---|---|---|---|
| 8,816,967 B2* | 8/2014 | Lyon | ........................ G06F 3/044 178/18.06 |
| 9,007,315 B2* | 4/2015 | Kim | ....................... G06F 3/0414 178/18.05 |
| 9,182,820 B1* | 11/2015 | Hebenstreit | .......... G09B 21/003 |
| 2008/0303782 A1 | 12/2008 | Grant et al. | |
| 2010/0215976 A1* | 8/2010 | Suwa | ....................... B32B 27/30 428/522 |
| 2010/0247810 A1* | 9/2010 | Yukinobu | ................. H01B 1/08 428/1.4 |
| 2010/0315353 A1 | 12/2010 | Huang et al. | |
| 2011/0043479 A1 | 2/2011 | Van Aerle et al. | |
| 2011/0095999 A1 | 4/2011 | Hayton | |
| 2012/0242588 A1 | 9/2012 | Myers et al. | |

(Continued)

FOREIGN PATENT DOCUMENTS

CN 103192558 A 7/2013

OTHER PUBLICATIONS

"Building Blocks for High-Performance Coating Applications", Bayer Material Science, Retrieved on May 12, 2015, Webpage available at : http://www.coatings.bayer.com/en/Applications/Overview.aspx?sc_camp=36AD90248BA94A2AAF7F220D27ED8B09.

(Continued)

*Primary Examiner* — Calvin C Ma
(74) *Attorney, Agent, or Firm* — Harrington & Smith

(57) ABSTRACT

An apparatus and method wherein the apparatus comprises; a flexible display; a flexible touch sensitive module; and a first flexible coating overlaying the flexible display and a second flexible coating overlaying the touch sensitive module; wherein at least a portion of the touch sensitive module is mounted on the first flexible coating.

20 Claims, 6 Drawing Sheets

(56) References Cited

U.S. PATENT DOCUMENTS

Figure 1:
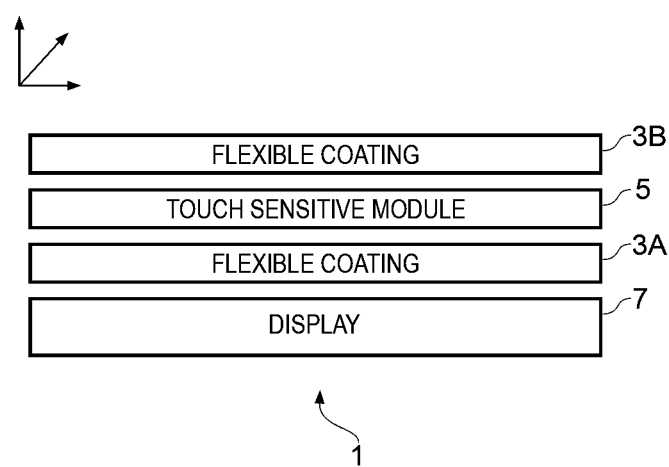

2012/0327048 A1   12/2012   Ramrattan et al.
2013/0083496 A1   4/2013    Franklin et al.
2014/0015772 A1   1/2014    Tung et al.
2014/0028596 A1   1/2014    Seo et al.

OTHER PUBLICATIONS

"Transparent Functional Oxide Stretchable Electronics: Micro-Tectonics Enabled High Strain Electrodes", NPG Asia Materials, Retrieved on May 12, 2015, Webpage available at : http://www.nature.com/am/journal/v5/n9/full/am201341a.html.
Search Report received for corresponding United Kingdom Patent Application No. 1408902.3, dated Nov. 24, 2014, 4 pages.

* cited by examiner

APPARATUS AND METHOD WHEREIN THE APPARATUS COMPRISES A FLEXIBLE DISPLAY AND A FLEXIBLE TOUCH SENSITIVE MODULE

TECHNOLOGICAL FIELD

Examples of the present disclosure relate to an apparatus and method wherein the apparatus comprises a flexible display and a flexible touch sensitive module. In particular, they relate to an apparatus and method wherein the apparatus comprises a flexible display and a flexible touch sensitive module and at least one coating configured to protect the touch sensitive module.

BACKGROUND

Flexible apparatus which may be bent or otherwise physically deformed by a user are known. For example apparatus such as flexible displays which may be bent or rolled or folded by a user are known.

It is useful to configure such flexible apparatus so as to reduce the likelihood of damage being caused to the apparatus by the bending or other physical deformation.

BRIEF SUMMARY

According to various, but not necessarily all, examples of the disclosure there may be provided an apparatus comprising; a flexible display; a flexible touch sensitive module; and a first flexible coating overlaying the flexible display and a second flexible coating overlaying the touch sensitive module; wherein at least a portion of the touch sensitive module is mounted on the first flexible coating.

In some examples at least a portion of the touch sensitive module may be printed on the first flexible coating.

In some examples the apparatus may comprise a plurality of contact pads configured to provide an electrical connection to the touch sensitive module. The display may provide a substrate and the plurality of contact pads may be provided on the substrate.

In some examples the apparatus may be flexible.

In some examples the flexible coatings may be transparent.

In some examples the second flexible coating may be arranged to provide an external cover for the apparatus.

In some examples the second flexible coating may be configured to provide a seal for components provided underneath the second flexible coating.

In some examples the first flexible coating may be arranged to provide an electrical insulation layer between the flexible display and the flexible touch sensitive module.

In some examples the first flexible coating may be arranged to reduce interference between the flexible display and the flexible touch sensitive module.

In some examples the apparatus may comprise a third flexible coating. In some examples a first portion of the touch sensitive module may be mounted on the first flexible coating and a second portion of the touch sensitive module is mounted on the third flexible coating.

In some examples the flexible coatings may comprise at least one of polyurethane, silicon, epoxy based elastomer.

In some examples there may also be provided a communication device comprising an apparatus as described above.

According to various, but not necessarily all, examples of the disclosure there may be provided a method comprising; providing a flexible display; providing a flexible touch sensitive module; and providing a first flexible coating overlaying the flexible display and a second flexible coating overlaying the touch sensitive module; wherein at least a portion of the touch sensitive module is mounted on the first flexible coating.

In some examples at least a portion of the touch sensitive module may be printed on the first flexible coating.

In some examples the method may further comprise providing a plurality of contact pads configured to provide an electrical connection to the touch sensitive module. The display may provide a substrate and the plurality of contact pads may be provided on the substrate.

In some examples the display and touch sensitive module may be provided within a flexible apparatus.

In some examples the flexible coatings may be transparent.

In some examples the second flexible coating may be arranged to provide an external cover for the apparatus.

In some examples the second flexible coating may be configured to provide a seal for components provided underneath the second flexible coating.

In some examples the first flexible coating may be arranged to provide an electrical insulation layer between the flexible display and the flexible touch sensitive module.

In some examples the first flexible coating may be arranged to reduce interference between the flexible display and the flexible touch sensitive module.

In some examples the method may further comprise providing a third flexible coating. A first portion of the touch sensitive module may be mounted on the first flexible coating and a second portion of the touch sensitive module is mounted on the third flexible coating.

In some examples the flexible coatings may comprise at least one of polyurethane, silicon, epoxy based elastomer.

According to various, but not necessarily all, examples of the disclosure there may be provided examples as claimed in the appended claims.

BRIEF DESCRIPTION

Figure 2A:
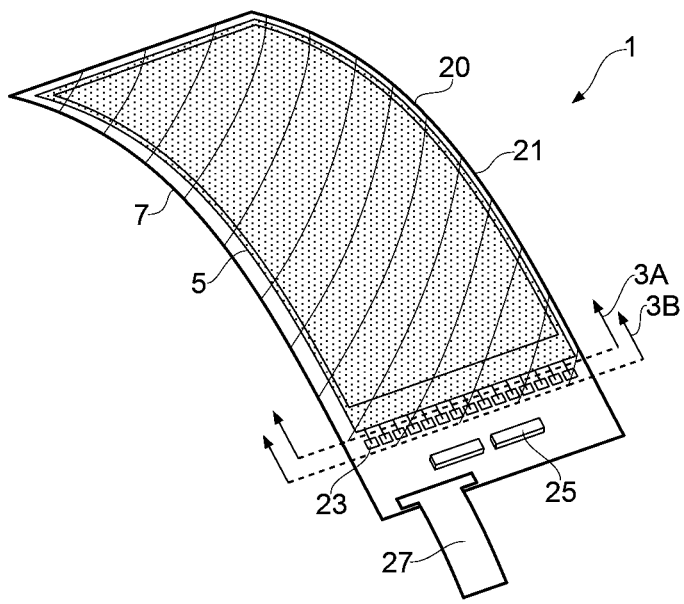
Figure 2B:
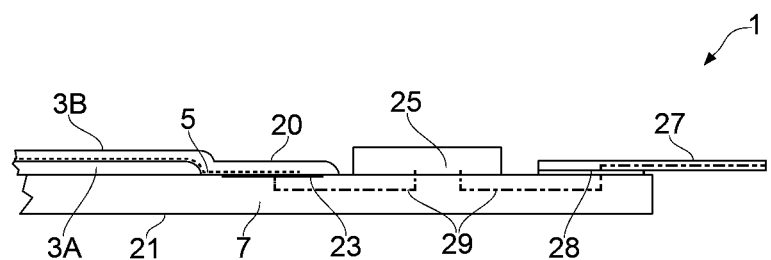
Figure 2B:
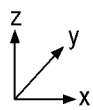
Figure 3A:
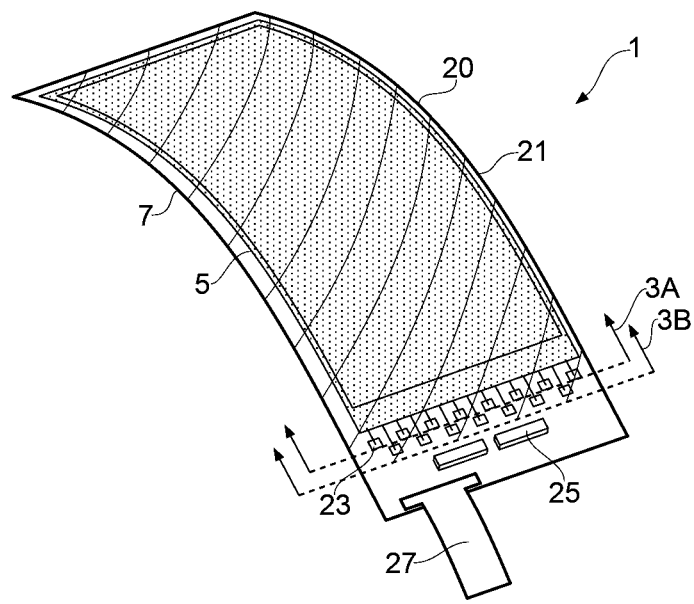
Figure 3B:
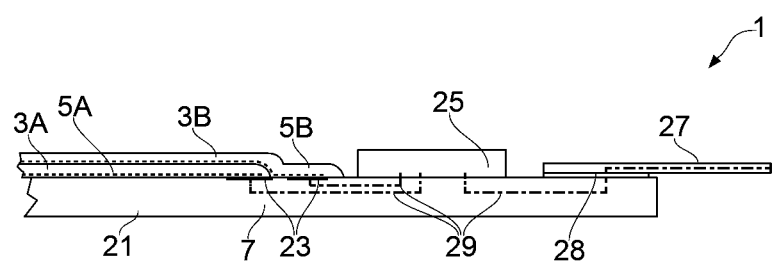
Figure 3B:
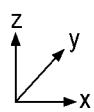
Figure 4A:
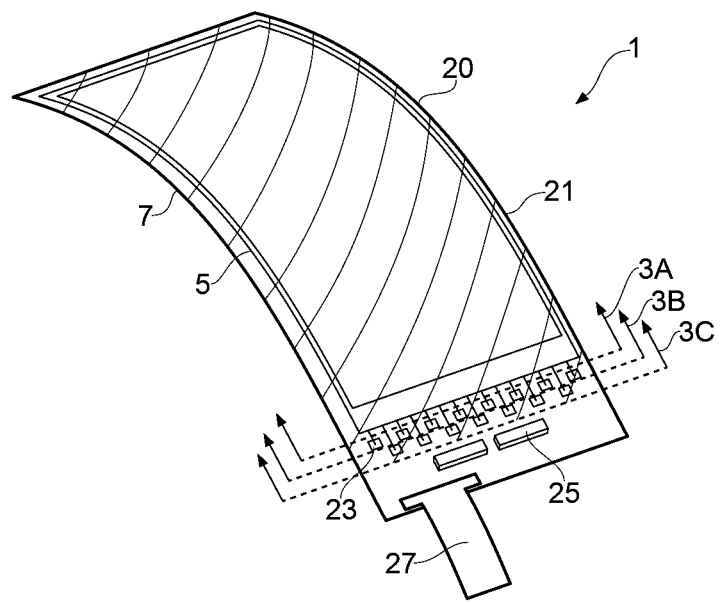
Figure 4B:
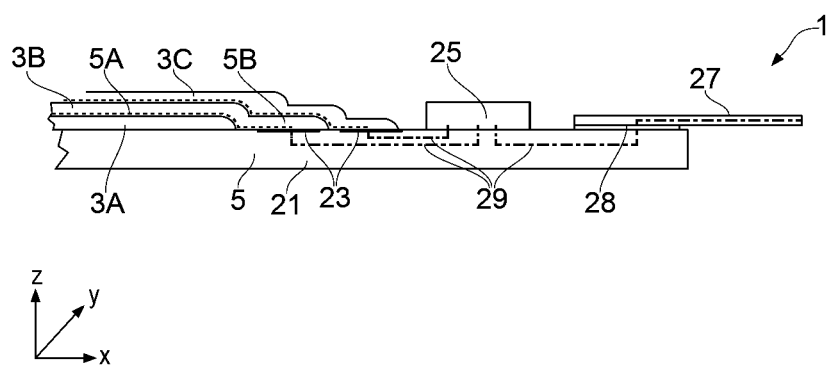
Figure 5:
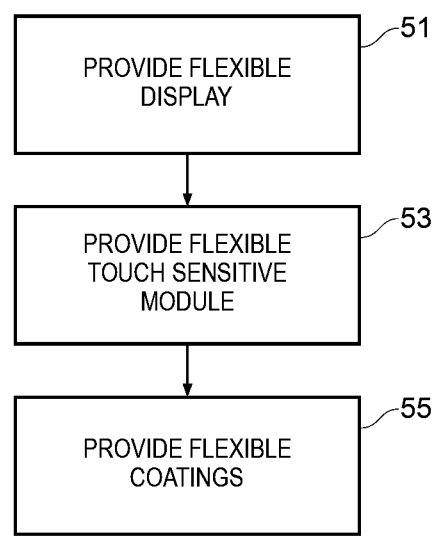
Figure 6A:
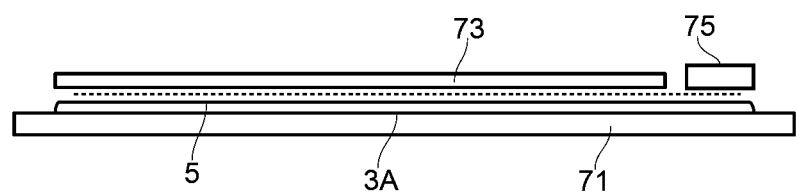
Figure 6B:
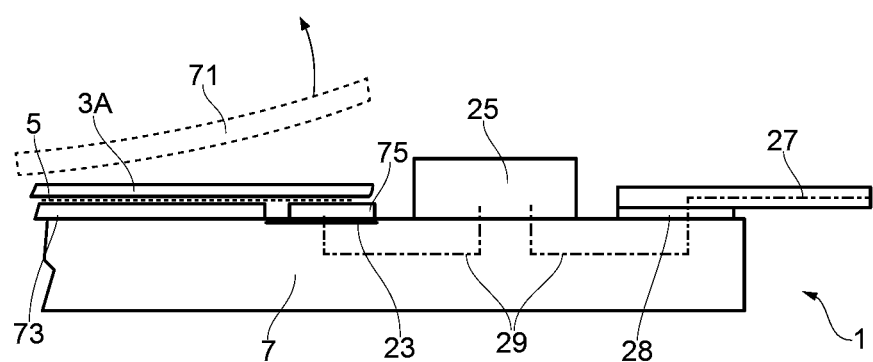

For a better understanding of various examples that are useful for understanding the detailed description, reference will now be made by way of example only to the accompanying drawings in which:

FIG. 1 illustrates an apparatus;
FIGS. 2A and 2B illustrate an apparatus;
FIGS. 3A and 3B illustrate an apparatus;
FIGS. 4A and 4B illustrate an apparatus;
FIG. 5 illustrates a method; and
FIGS. 6A and 6B illustrate a method of providing an apparatus.

DETAILED DESCRIPTION

The Figures illustrate an apparatus 1 comprising; a flexible display 7; a flexible touch sensitive module 5; and a first flexible coating 3A overlaying the flexible display 7 and a second flexible coating 3B overlaying the touch sensitive module 5; wherein at least a portion of the touch sensitive module 5 is mounted on the first flexible coating 3A.

Examples of the disclosure provide for a thin and flexible apparatus 1. The apparatus 1 may be arranged so that it may be bent or otherwise deformed by the user. The flexible coatings 3A, 3B may be arranged to prevent the apparatus 1 being damaged when it is bent or otherwise deformed. In some examples the flexible coating 3 may be configured to move or deform when the apparatus 1 is deformed in order to help to prevent delamination of the layers of the apparatus 1.

FIG. 1 illustrates a cross section through an example apparatus 1. FIG. 1 also illustrates a reference coordinate axis. In this example the x axis runs horizontally and parallel with the surface of the apparatus 1, the y axis extends into the page and runs parallel with the surface of the apparatus 1 and the z axis extends vertically in a direction perpendicular to the surface of the apparatus 1.

The example apparatus 1 of FIG. 1 comprises a plurality of electronic components 5, 7 and a plurality of flexible coatings 3. Only features referred to in the description are illustrated in FIG. 1. However, it should be appreciated that the apparatus 1 may comprise additional features that are not illustrated. For example, the apparatus 1 may comprise additional features such as driver electronics, flexi-connections, contact pads or any other suitable components.

The apparatus 1 may be provided within an electronic device. The apparatus 1 may be provided within an electronic device such as a communication device, a mobile cellular telephone, a tablet computer, a personal computer, a camera, or any other apparatus which may comprise a plurality of electronic components arranged in layers. In some examples the electronic device may be a handheld device which can be held in a user's hand during use. In some examples the electronic device may be wearable so that the device may be secured to part of a user's body such as their wrist.

In the example of FIG. 1 the apparatus 1 comprises a display 7 and a touch sensitive module 5. It is to be appreciated that in other examples the apparatus 1 may comprise other electronic components. For instance the apparatus 1 could comprise sensor arrangements or any other suitable electronic components. In the example of FIG. 1 both the display 7 and the touch sensitive module 5 are flexible.

The display 7 may comprise any means which enables information to be displayed to a user of the apparatus 1. The information may correspond to information which has been input by the user via a user input device and/or information which is stored in memory circuitry or any other information.

The display 7 may comprise any suitable display such as a liquid crystal display, light emitting diode (LED), organic light emitting diode (OLED), thin film transistor, electrophoretic ink or any other suitable type of display.

The touch sensitive module 5 may be positioned overlaying the display 7. In the example of FIG. 1 the display 7 is provided in a first layer and the touch sensitive module 5 is provided in a second, different, layer. It is to be appreciated that in other examples of the disclosure any number of layers may be provided. In the example of FIG. 1 a first flexible coating 3A is provided between the display 7 and the touch sensitive module 5.

The touch sensitive module 5 may comprise any means which may be configured to enable user inputs to be detected. The touch sensitive module 5 may be configured to enable touch inputs to be detected. A user may make such a touch input by touching the surface of the apparatus 1 with one or more objects such as their fingers. In some examples a user may make a touch input by positioning one or more objects such as their fingers close to the surface of the apparatus 1.

The touch sensitive module 5 may comprise any suitable type of sensors. In some examples the touch sensitive module 5 may comprise one or more capacitive sensors. The capacitive sensors may comprise a layer of conductive material. In some examples of the disclosure the conductive material may be arranged in a grid or other suitable array. The conductive material may be transparent to enable the display 7 to be visible through the touch sensitive module 5. The conductive material may comprise any suitable material such as indium tin oxide.

The touch sensitive module 5 may comprise other types of sensor instead of, or in addition to, capacitive sensors. For example, the touch sensitive module 5 may comprise infra red sensors, resistive sensors or any other suitable types of sensor.

In the example apparatus 1 of FIG. 1 the apparatus 1 also comprises a first flexible coating 3A and a second flexible coating 3B.

The first flexible coating 3A may be provided overlaying the display 7. The first flexible coating 3A may be configured to cover at least a portion of the flexible display 7. The first flexible coating 3A may be provided between the display 7 and the touch sensitive module 5. The touch sensitive module 5 may be mounted on the first flexible coating 3A.

The first flexible coating 3A may be arranged to provide an electrical insulation layer between the display 7 and the touch sensitive module 5. In some examples the first flexible coating 3A may be arranged to reduce interference between the display 7 and the touch sensitive module 5.

The second flexible coating 3B may be provided overlaying the touch sensitive module 5. The second flexible coating 3B may be configured to cover at least a portion of the plurality of touch sensitive module 5 and the display 7.

The second flexible coating 3B may provide a surface of the apparatus 1. The user may touch the second flexible coating 3B when they use the apparatus 1. For example they may touch the second flexible coating 3B when they actuate the touch sensitive module 5 or when they hold the apparatus 1 in their hand.

In some examples the second flexible coating 3B may form part of an external cover for the apparatus 1. The external cover may be arranged to protect the electronic components such as the display 7 and the touch sensitive module 5. In some examples the external cover may form a protective barrier layer which may protect the electronic components 5, 7 from fluid ingress.

In the example of FIG. 1 the second flexible coating 3B overlays a touch sensitive module 5. The second flexible coating 3B may comprise an electrically insulating material which may enable the touch sensitive module 5 to detect capacitive touch inputs.

In some examples one or both of the flexible coatings 3 may form a self healing cover. For instance the flexible coatings 3 may comprise a material such as polyurethane or any other suitable material which may be configured to reform back to its original state if it is scratched or otherwise damaged.

In the example of FIG. 1 the flexible coatings 3 overlay a display 7. The flexible coating 3 may be transparent so that the display 7 is visible through the flexible coatings 3. In other examples the apparatus 1 might comprise other components instead of a display 7. In such examples the flexible coating 3 need not be transparent.

In some examples flexible coatings 3 may be configured to move when the apparatus 1 is deformed. The flexible coatings 3 may be configured to move relative to the contact pads 23 of the apparatus 1 when the apparatus 1 is deformed. The flexible coatings 3 may be configured to slide relative to the contact pads 23. The contact pads 23 may be fixed in position on a substrate and the flexible coatings 3 may be configured to stretch so that a portion of the flexible coatings 3 can slide over the contact pads 23. The movement of the flexible coatings 3 may help to prevent delamination of the apparatus 1.

In some examples the flexible coatings 3 may be configured to couple layers of the apparatus 1 together. In some examples the flexible coatings 3 may be configured to couple layers of the apparatus 1 together so that no additional adhesive layers are needed. In some examples no adhesive layers might be needed between the flexible coating 3 and the layers of the electronic components of the apparatus 1. For instance, portions of the touch sensitive module 5 may be printed on one or more of the flexible coatings 3. In other examples no adhesive layers might be needed between the layers of the apparatus 1.

The flexible coatings 3 may be made of any suitable material such as polyurethane, silicon or epoxy based elastomer or any other suitable material.

The apparatus 1 may be a flexible apparatus 1. The flexible apparatus 1 may be arranged so that the apparatus 1 may be bent or otherwise physically deformed by a user applying a force to the apparatus 1 or making an appropriate user input. The physical deformation may comprise bending, folding, twisting or stretching or other contortion of the apparatus 1 or a portion of the apparatus 1. Each of the layers of the apparatus 1 may be flexible. In the example of FIG. 1 the display 7, the touch sensitive module 5 and the flexible coating 3 may each be flexible.

In the cross section of FIG. 1 the touch sensitive module 5, the display 7 and the flexible coatings 3 are arranged in a plurality of layers. The plurality of layers extend in the z direction. The plurality of layers form a laminar structure. The apparatus 1 may provide a surface which extends in the x and y directions. The x and y directions may be perpendicular or substantially perpendicular to the z direction.

It is to be appreciated that in the cross section of FIG. 1 the apparatus is not bent or deformed. As the apparatus 1 is not bent or deformed the layers are flat or substantially flat. When the apparatus 1 is deformed the layers may be bent or rolled or twisted or otherwise deformed.

The flexible coatings 3 may be arranged so that when the apparatus 1 is bent or otherwise deformed the flexible coatings 3 may also bend or deform. As the flexible coatings 3 can be bent or deformed this allows the flexible coating 3 to deform relative to the touch sensitive module 5 and the display 7. This may reduce the amount of strain or other forces applied to the electronic components. This may help to prevent delamination or other failure of the apparatus 1.

FIGS. 2A and 2B illustrate another apparatus 1 according to examples of the disclosure. FIG. 2A illustrates a perspective view of the apparatus 1 and FIG. 2B illustrates a cross section through the apparatus 1. The example apparatus 1 of FIGS. 2A and 2B comprises a display 7, a touch sensitive module 5 and a first flexible coating 3A and a second flexible coating 3B as described above with reference to FIG. 1. Corresponding reference numerals are used for corresponding components.

Reference coordinate axes are illustrated in FIG. 2B to assist comparison with FIG. 1. It is to be appreciated that the surface 20 of the apparatus 1 illustrated in FIG. 2A extends in the x-y plane of FIG. 2B.

In the example of FIGS. 2A and 2B the display 7 provides a substrate 21 which also supports the touch sensitive module 5 and the flexible coatings 3. The substrate 21 may be a flexible substrate.

The first flexible coating 3A may be provided overlaying at least a portion of the display 7. The first flexible coating 3A may directly overlay the display 7 without any intervening components.

The first flexible coating 3A may be arranged to reduce interference between the display 7 and the touch sensitive module 5. In such examples the first flexible coating 3A may comprise an electrically insulating material.

The touch sensitive module 5 is indicated by the dotted region in FIG. 2A. The touch sensitive module 5 overlays the display 7. In the example of FIGS. 2A and 2B the first flexible coating 3A is provided between the touch sensitive module 5 and the display 7.

The touch sensitive module 5 may be provided overlaying the first flexible coating 3A. The touch sensitive module 5 may directly overlay the first flexible coating 3A without any intervening components. In some examples the touch sensitive module 5 or a portion of the touch sensitive module 5 may be mounted on the first flexible coating 3A. In some examples the touch sensitive module 5 or a portion of the touch sensitive module 5 may be printed on the first flexible coating 3A.

The second flexible coating 3B is indicated by the hatched lines in FIG. 2A. The second flexible coating 3B overlays both the touch sensitive module 5 and the display 7 so that the flexible coating 3 covers at least a portion of the touch sensitive module 5 and the display 7. In the example of FIGS. 2A and 2B the second flexible coating 3B directly overlays both the touch sensitive module 5 and the display 7 with no intervening layers.

The second flexible coating 3B may be arranged to provide a protective cover for the apparatus 1. The protective cover may form part of the external housing of an apparatus 1 or device which houses the apparatus 1. The protective cover may form a seal around the electronic components of the apparatus 1.

It is to be appreciated that in the example of FIGS. 2A and 2B the touch sensitive module 5 and the first flexible coating 3A and the second flexible coating 3B may be transparent to enable the display 7 to be visible through the overlaying layers.

In the example of FIGS. 2A and 2B the substrate 21 also supports additional electronic components. In the example of FIGS. 2A and 2B the additional electronic components comprise a plurality of contact pads 23, driver electronics 25 and a flexi connection 27. It is to be appreciated that other components may be provided in other examples of the disclosure.

The plurality of contact pads 23 may comprise means for providing electrical connections to the touch sensitive module 5. The plurality of contact pads 23 may enable control signals to be provided to the touch sensitive module 5 and may enable response signals to be obtained from the touch sensitive module 5.

In the example of FIGS. 2A and 2B the plurality of contact pads 23 are provided on the substrate 21 adjacent to the touch sensitive module 5. The second flexible coating 3B is arranged to cover both the touch sensitive module 5 and the plurality of contact pads 23. The second flexible coating 3B may be arranged to move relative to the plurality of contact pads 23 when the apparatus 1 is deformed. The second flexible coating 3B may be arranged to move relative to the plurality of contact pads 23 when the apparatus 1 is bent.

The driver electronics 25 may comprise any means which may be configured to control the touch sensitive module 5 and/or the display 7. The driver electronics 25 may be configured to provide control signals to the touch sensitive module 5 and/or the display 7. The driver electronics 25 may also be configured to obtain output signals from the touch sensitive module 5 and any other electronic components.

In the example of FIGS. 2A and 2B the substrate 21 also supports a flexi connection 27. The flexi connection 27 may be coupled to the substrate 21 by a layer of adhesive 28. The adhesive may comprise an anisotropic conductive film or any other suitable type of adhesive.

The flexi connection 27 may be coupled to the plurality of contact pads 23 via the driver electronics 25. The flexi connection 27 may enable the apparatus 1 to be connected to one or more controllers. The dashed lines 29 in FIG. 2B represent the electronic connections between the flexi connection 27, the driver electronics and the plurality of contact pads 23. The one or more controllers may be mounted on a PCB or housed within an electronic device. The flexi connection 27 may enable control signals to be provided to the driver electronics 25.

In the example of FIG. 2A the apparatus 1 is bent. In the example of FIG. 2A the apparatus is bent so that a portion of the surface 20 curves downwards. It is to be appreciated that other deformations of the apparatus 1 may be made in other examples. For instance, in some examples the apparatus 1 may be arranged so that the apparatus 1 can be folded double over itself.

In the example of FIGS. 2A and 2B the total thickness of the apparatus 1 may be between 0.2-0.3 mm. The thickness of the apparatus 1 may be defined as the height of the apparatus 1 in the z direction when the apparatus 1 is not deformed. It is to be appreciated that the thickness of the apparatus 1 may vary depending on the number and type of electronic components included in the apparatus 1.

The thickness of the apparatus 1 is small in the examples of FIGS. 2A and 2B because the touch sensitive module 5 is mounted on the first flexible coating 3A this removes the need for any additional adhesive and so makes the apparatus 1 thinner.

As the flexible coatings 3 may be configured to move when the apparatus 1 is deformed this may help to prevent delamination of the apparatus 1.

Also the flexible coatings 3 may be made of a flexible material such as polyurethane, silicon or epoxy based elastomer or any other suitable material. This may allow the flexible coatings 3 to deform when the apparatus 1 is bent or otherwise deformed. As the flexible coatings 3 deform this prevents delamination or other damage being caused to the apparatus 1.

Also the flexible coatings 3 may be arranged to cover at least a portion of both the display 7 and the touch sensitive module 5. This may enable the display 7 and the touch sensitive module 5 to be coupled together without the need for any adhesive layers.

FIGS. 3A and 3B illustrate another apparatus 1 according to examples of the disclosure. FIG. 3A illustrates a perspective view of the apparatus 1 and FIG. 3B illustrates a cross section through the apparatus 1. The example apparatus 1 of FIGS. 3A and 3B comprises a display 7, a touch sensitive module 5 and a plurality of flexible coatings 3 as described above with reference to FIG. 1 and FIGS. 2A and 2B. The apparatus 1 also comprises additional electronic components such as a plurality of contact pads 23, driver electronics 25 and a flexi connection 27 as described above. Corresponding reference numerals are used for corresponding components.

Reference coordinate axes are illustrated in FIG. 3B to assist comparison with FIG. 1 and FIGS. 2A and 2B. It is to be appreciated that the surface 20 of the apparatus 1 illustrated in FIG. 3A extends in the x-y plane of FIG. 3B.

In the example of FIGS. 3A and 3B the apparatus 1 comprises a flexible display 7, a flexible touch sensitive module 5 and two flexible coatings 3A and 3B. In the examples of FIGS. 3A and 3B the touch sensitive module 5 is provided in a plurality of layers 5A and 5B.

The first layer of the touch sensitive module 5A is provided overlaying the display 7. The first layer of the touch sensitive module 5A may be provided overlaying at least a portion of the display 7. The first layer of the touch sensitive module 5A may directly overlay the display 7 without any intervening components.

The first flexible coating 3A is provided overlaying the display 7 and the first layer of the touch sensitive module 5A. The first flexible coating 3A may be provided between the first layer of the touch sensitive module 5A and the second layer of the touch sensitive module 5B. The first flexible coating 3A may be provided overlaying at least a portion of the first layer of the touch sensitive module 5A. The first flexible coating 3A may directly overlay the first layer of the touch sensitive module 5A without any intervening components.

The first flexible coating 3A may be arranged to reduce interference and/or provide an insulating layer between the layers of the touch sensitive module 5. In such examples the first flexible coating 3A may comprise an electrically insulating material.

The first flexible coating 3A may be arranged to reduce interference between the display 7 and the touch sensitive module 5. In such examples the first flexible coating 3A may comprise an electrically insulating material.

The second layer of the touch sensitive module 5B may be provided overlaying the first flexible coating 3A. The second layer of the touch sensitive module 5B may directly overlay the first flexible coating 3A without any intervening components. In some examples the second layer of the touch sensitive module 5B or a portion of the second layer of the touch sensitive module 5B may be mounted on the first flexible coating. For example a portion of the second layer of the touch sensitive module 5A may be printed on the first flexible coating 3A.

The second flexible coating 3B may be provided overlaying both the display 7 and the touch sensitive module 5. The second flexible coating 3B may directly overlay the second layer of the touch sensitive module 5B without any intervening components.

The second flexible coating 3B may be arranged to provide a protective cover for the apparatus 1. The protective cover may form part of the external housing of an apparatus 1 or device which houses the apparatus 1.

In the examples of FIGS. 3A and 3B second flexible coating 3B may be arranged to cover the plurality of contact pads 23 whereas the first flexible coating 3A does not. This ensures that the plurality of contact pads 23 are protected by the second flexible coating 3B. The first flexible coating 3A may be arranged to move to cover the contact pads 23 when the apparatus 1 is deformed. The movement of the flexible coating 3 may help to prevent delamination of the apparatus 1 when it is bent.

FIGS. 4A and 4B illustrate another apparatus 1 according to examples of the disclosure. FIG. 5A illustrates a perspective view of the apparatus 1 and FIG. 5B illustrates a cross section through the apparatus 1. The example apparatus 1 of FIGS. 4A and 4B comprise a display 7, a touch sensitive module 5 and a plurality of flexible coatings 3 as described above with reference to FIG. 1 and FIGS. 2A to 3B. The apparatus 1 also comprises additional electronic components such as a plurality of contact pads 23, driver electronics 25 and a flexi connection 27 as described above. Corresponding reference numerals are used for corresponding components.

Reference coordinate axes are illustrated in FIG. 4B to assist comparison with FIG. 1 and FIGS. 2A to 3B. It is to be appreciated that the surface 20 of the apparatus 1 illustrated in FIG. 4A extends in the x-y plane of FIG. 4B.

In the example of FIGS. 4A and 4B the apparatus 1 comprises three flexible coatings 3A, 3B and 3C. In the examples of FIGS. 5A and 5B the touch sensitive module 5 is provided in a plurality of layers 5A and 5B.

The first flexible coating 3A is provided between the display 7 and the first layer of the touch sensitive module 5A. The first flexible coating 3A may be provided overlaying at least a portion of the display 7. The first flexible coating 3A may directly overlay the display 7 without any intervening components.

The first layer of the touch sensitive module 5A is provided overlaying the first flexible coating 3A. The first layer of the touch sensitive module 5A may be provided overlaying at least a portion of the first flexible coating 3A. The first layer of the touch sensitive module 5A may directly overlay the first flexible coating 3A without any intervening components. In some examples the first layer of the touch sensitive module 5A or a portion of the first layer of the touch sensitive module 5A may be mounted on the first flexible coating 3A. For instance a portion of the first layer of the touch sensitive module 5A may be printed on the first flexible coating 3A.

The second flexible coating 3B is provided between the first layer of the touch sensitive module 5A and the second layer of the touch sensitive module 5B. The second flexible coating 3B may be provided overlaying at least a portion of the first layer of the touch sensitive module 5A. The second flexible coating 3B may directly overlay the first layer of the touch sensitive module 5A without any intervening components.

The second flexible coating 3B may be arranged to reduce interference and/or provide an insulating layer between the layers of the touch sensitive module 5. In such examples the second flexible coating 3B may comprise an electrically insulating material.

The second layer of the touch sensitive module 5B may be provided overlaying the second flexible coating 3B. The second layer of the touch sensitive module 5B may directly overlay the second flexible coating 3B without any intervening components. In some examples the second layer of the touch sensitive module 5B or a portion of the second layer of the touch sensitive module 5B may be mounted on the second flexible coating 3B. For instance a portion of the second layer of the touch sensitive module 5B may be printed on the second flexible coating 3B.

The third flexible coating 3C may be provided overlaying both the display 7 and the touch sensitive module 5. The third flexible coating 3C may directly overlay the second layer of the touch sensitive module 5B without any intervening components.

The third flexible coating 3C may be arranged to provide a protective cover for the apparatus 1. The protective cover may form part of the external housing of an apparatus 1 or device which houses the apparatus 1.

In the examples of FIGS. 4A and 4B third flexible coating 3C may be arranged to cover all of the plurality of contact pads 23 whereas the second flexible coating 3B only covers a portion of the plurality of contact pads 23. The first flexible coating 3A does not cover any of the plurality of contact pads 23. This ensures that the plurality of contact pads 23 are protected by the third flexible coating 3C. The first flexible coating 3A may be arranged to move relative to the contact pads 23 when the apparatus 1 is deformed. The first flexible coating 3A may move over the contact pads 23 when the apparatus is deformed. The first flexible coating 3A may be arranged to move to cover some of or all of the contact pads 23 when the apparatus 1 is deformed. The second flexible coating 3B may be arranged to move to cover all of the contact pads 23 when the apparatus 1 is deformed. The movement of the flexible coatings 3 may help to prevent delamination of the apparatus 1 when it is bent.

It is to be appreciated that the examples illustrated in FIGS. 2A to 4B are examples and that other implementations of the disclosure could include any number or arrangement of layers of flexible coatings and electronic components 5, 7.

FIG. 5 illustrates a method. The method comprises providing, at block 51, a flexible display 7 and providing, at block 53, a flexible touch sensitive module 5. The method also comprises providing flexible coatings at block 55. A first flexible coating 3A may be provided overlaying the flexible display 5 and a second flexible coating 3B may be provided overlaying the touch sensitive module 5. At least a portion of the touch sensitive module 5 may be mounted on the first flexible coating 3A.

FIGS. 6A and 6B illustrate another method of providing an apparatus 1. In FIG. 6A at least a portion of a touch sensitive module 5 is formed on a first flexible coating 3A. In FIG. 6B the touch sensitive module 5 is coupled to a display 7. The example method of FIGS. 6A and 6B may be used to form an apparatus 1 such as the apparatus 1 of FIGS. 3A and 3B. It is to be appreciated that similar methods may be used to create other apparatus 1 as described above.

FIG. 6A shows a method of providing a flexible coating 3 and a touch sensitive module 5. In FIG. 6A a carrier sheet 71 is provided. The carrier sheet 71 may be made of any suitable material. The carrier sheet 71 may be flexible to enable it to be removed from the assembled touch sensitive module 5.

A first flexible coating 3A is formed on the carrier sheet 71. The first flexible coating 3A may comprise any suitable material as described above. The flexible coating 3A may be cured on the carrier sheet 71 before the touch sensitive module 5 is attached.

The touch sensitive module 5 may be formed on the first flexible coating 3A. In some examples the touch sensitive module 5 may be printed on the first flexible coating 3A. The touch sensitive module 5 may be as described above in relation to FIGS. 3A to 3B.

In the example of FIG. 6A an optically clear adhesive 73 is coated over the touch sensitive module 5. The optically clear adhesive 73 may comprise any suitable material which may enable the touch sensitive module 5 to be adhered to the display 7. In some examples the optically clear adhesive 73 may comprise acrylic, polyurethane, methylmethacrylate or silicone-based adhesives or any other suitable adhesive.

An electrical connection 75 is also provided on the touch sensitive module 5. The electrical connection 75 may comprise any means which may enable the touch sensitive module 5 to be electrically connected to control circuitry such as the driver electronics 25. The electrical connection 75 may enable a galvanic connection to conductive traces on a substrate or other circuit board. In some examples the electrical connection 75 may comprise a conductive adhesive.

FIG. 6B illustrates an apparatus 1 being assembled by coupling the touch sensitive module 5 to the display 7. The example apparatus 1 of FIG. 6B comprises contact pads 23, driver electronics 25 and a flexi connection 27 as described above.

In the example of FIG. 6B the optically clear adhesive 73 is used to couple the display 7 to the touch sensitive module 5. The electrical connection 75 is used to couple the touch sensitive module 5 to the contact pads 23. Once the touch sensitive module 5 is coupled to the display 7 the carrier sheet 71 is removed. This leaves the first flexible coating 3A as overlaying the display 7 and the portion of the touch sensitive module 5.

In some examples one or more additional layers may be provided overlaying the first flexible coating 3A. For instance, in order to create an apparatus 1 as illustrated in FIGS. 3A and 3B a second layer of the touch sensitive module 5 and a second flexible coating 3B may be provided.

In the example of FIGS. 6A and 6B the display 7 and the touch sensitive module 5 can be manufactured separately and an adhesive is used to couple the display 7 and touch sensitive module 5 together. This may provide a quick method of manufacturing an apparatus 1. As the touch sensitive module 5 is printed on the flexible coating 3 there is no need for an adhesive between the touch sensitive module 5 and the flexible coating 3 and so this enables the apparatus 1 to be thin and flexible.

It is to be appreciated that other methods of providing an apparatus 1 may be used in other examples of the disclosure. For instance in some examples the touch sensitive module 5 may be mounted directly on the display 7 without any intervening adhesive.

Where a structural feature has been described, it may be replaced by means for performing one or more of the functions of the structural feature whether that function or those functions are explicitly or implicitly described.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
 a flexible display, the flexible display providing a substrate having a plurality of contact pads;
 a flexible touch sensitive module;
 a first flexible coating overlying the flexible display between the flexible display and the flexible touch sensitive module, said first flexible coating coupling said flexible display and said flexible touch sensitive module to one another; and
 a second flexible coating overlying the flexible touch sensitive module,
 wherein at least a portion of the flexible touch sensitive module is mounted on the first flexible coating,
 wherein the flexible display, the flexible touch sensitive module, the first flexible coating, and the second flexible coating are sufficiently flexible to be bent, folded, twisted, stretched, or otherwise physically deformed without damage to the apparatus, and
 wherein the first flexible coating and the second flexible coating are sufficiently deformable and stretchable relative to the flexible display and the flexible touch sensitive module when the apparatus is deformed to prevent delamination of the apparatus.

2. The apparatus as claimed in claim 1, wherein at least a portion of the flexible touch sensitive module is printed on the first flexible coating.

3. The apparatus as claimed in claim 1, wherein the plurality of contact pads provides at least an electrical connection to the flexible touch sensitive module.

4. The apparatus as claimed in claim 1, wherein the apparatus is flexible.

5. The apparatus as claimed in claim 1, wherein at least one of the first and second flexible coatings is transparent.

6. The apparatus as claimed in claim 1, wherein the second flexible coating provides an external cover for the apparatus.

7. The apparatus as claimed in claim 1, wherein the second flexible coating provides a seal for components provided underneath the second flexible coating.

8. The apparatus as claimed in claim 1, wherein the first flexible coating provides an electrical insulation layer between the flexible display and the flexible touch sensitive module.

9. The apparatus as claimed in claim 1, wherein the first flexible coating reduces interference between the flexible display and the flexible touch sensitive module.

10. The apparatus as claimed in claim 1, further comprising a third flexible coating, said third flexible coating overlying said second flexible coating.

11. The apparatus as claimed in claim 10, wherein a first portion of the flexible touch sensitive module is mounted on the first flexible coating and a second portion of the flexible touch sensitive module is mounted on the second flexible coating.

12. The apparatus as claimed in claim 1, wherein the first and second flexible coatings comprise at least one of polyurethane, silicon, and epoxy-based elastomer.

13. A method comprising:
   providing a flexible display, the flexible display providing a substrate having a plurality of contact pads;
   providing a flexible touch sensitive module;
   providing a first flexible coating overlying the flexible display between the flexible display and the flexible touch sensitive module, said first flexible coating coupling said flexible display and said flexible touch sensitive module to one another; and
   a second flexible coating overlying the flexible touch sensitive module,
   wherein at least a portion of the flexible touch sensitive module is mounted on the first flexible coating,
   wherein the flexible display, the flexible touch sensitive module, the first flexible coating, and the second flexible coating are sufficiently flexible to be bent, folded, twisted, stretched, or otherwise physically deformed without damage, and
   wherein the first flexible coating and the second flexible coating are sufficiently deformable and stretchable relative to the flexible display and the flexible touch sensitive module when the flexible display, the flexible touch sensitive module, the first flexible coating, and the second flexible coating are deformed to prevent delamination from one another.

14. The method as claimed in claim 13, wherein at least a portion of the flexible touch sensitive module is printed on the first flexible coating.

15. The method as claimed in claim 13, wherein the plurality of contact pads provides at least an electrical connection to the flexible touch sensitive module.

16. The method as claimed in claim 13, wherein at least one of the first and second flexible coatings is transparent.

17. The method as claimed in claim 13, wherein the second flexible coating provides a seal for components provided underneath the second flexible coating.

18. The method as claimed in claim 13, further comprising providing a third flexible coating, said third flexible coating overlying said second flexible coating.

19. The method as claimed in claim 18, wherein a first portion of the flexible touch sensitive module is mounted on the first flexible coating and a second portion of the flexible touch sensitive module is mounted on the second flexible coating.

20. An electronic device comprising:
   a flexible display, the flexible display providing a substrate having a plurality of contact pads;
   a flexible touch sensitive module;
   a first flexible coating overlying the flexible display between the flexible display and the flexible touch sensitive module, said first flexible coating coupling said flexible display and said flexible touch sensitive module to one another; and
   a second flexible coating overlying the flexible touch sensitive module,
   wherein at least a portion of the flexible touch sensitive module is mounted on the first flexible coating,
   wherein the flexible display, the flexible touch sensitive module, the first flexible coating, and the second flexible coating are sufficiently flexible to be bent, folded, twisted, stretched, or otherwise physically deformed without damage to the apparatus, and
   wherein the first flexible coating and the second flexible coating are sufficiently deformable and stretchable relative to the flexible display and the flexible touch sensitive module when the electronic device is deformed to prevent delamination of the electronic device.

* * * * *